United States Patent
Son et al.

(10) Patent No.: US 9,576,664 B2
(45) Date of Patent: Feb. 21, 2017

(54) THREE DIMENSIONAL SEMICONDUCTOR MEMORY DEVICE

(71) Applicant: SK hynix Inc., Gyeonggi-do (KR)

(72) Inventors: Chang Man Son, Gyeonggi-do (KR); Go Hyun Lee, Gyeonggi-do (KR); Sung Lae Oh, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/096,861

(22) Filed: Dec. 4, 2013

(65) Prior Publication Data

US 2015/0041901 A1 Feb. 12, 2015

(30) Foreign Application Priority Data

Aug. 7, 2013 (KR) .................. 10-2013-0093757

(51) Int. Cl.
*G11C 16/04* (2006.01)
*H01L 27/115* (2006.01)
*H01L 29/792* (2006.01)

(52) U.S. Cl.
CPC ...... *G11C 16/0483* (2013.01); *H01L 27/1157* (2013.01); *H01L 27/11582* (2013.01); *H01L 29/7926* (2013.01); *H01L 27/11573* (2013.01)

(58) Field of Classification Search
CPC ......... H01L 27/1052; H01L 2924/1438; H01L 27/11524; H01L 27/11529; H01L 27/1157
See application file for complete search history.

(56) References Cited

U.S. PATENT DOCUMENTS

| | | | | |
|---|---|---|---|---|
| 6,027,973 A | * | 2/2000 | He | H01L 27/11521 257/E21.69 |
| 6,180,454 B1 | * | 1/2001 | Chang | H01L 27/115 257/E21.69 |
| 8,422,325 B2 | * | 4/2013 | Choi | G11C 7/12 365/189.09 |
| 2010/0302851 A1 | * | 12/2010 | Ryu | G11C 16/24 365/185.12 |
| 2010/0329008 A1 | * | 12/2010 | Cho | G11C 16/0483 365/185.05 |
| 2013/0242668 A1 | * | 9/2013 | Kim | G11C 16/3404 365/185.19 |

FOREIGN PATENT DOCUMENTS

KR 101054554 8/2011

* cited by examiner

*Primary Examiner* — Bilkis Jahan
(74) *Attorney, Agent, or Firm* — IP & T Group LLP

(57) ABSTRACT

A semiconductor memory device may include a string including at least one drain select transistor, a plurality of first memory cells, a first connection element, a plurality of second memory cells, a second connection element, a plurality of third memory cells, and at least one source select transistor, wherein the at least one drain select transistor, the plurality of first memory cells, the plurality of second memory cells, the plurality of third memory cells, and the at least one source select transistor connected serially via the first connection element and the second connection element.

18 Claims, 11 Drawing Sheets

THREE DIMENSIONAL SEMICONDUCTOR MEMORY DEVICE

CROSS-REFERENCE TO RELATED APPLICATION

The present application claims priority of Korean patent application number 10-2013-0093757, filed on Aug. 7, 2013, the entire disclosure of which is incorporated herein by reference in its entirety.

BACKGROUND

Field of Invention

Various embodiments of the present invention relate to a semiconductor memory device, and more particularly, to a 3D semiconductor memory device.

Description of Related Art

In general, a semiconductor memory device is formed in a 2D structure in which memory cells are formed on a substrate in a single layer. The 2D semiconductor memory device improves integration of the memory cells by decreasing a flat surface are occupied by each of the memory cells by a micro pattern forming technology.

As the technology of improving integration of the 2D semiconductor memory device reaches the limit, a 3D semiconductor memory device, in which memory cells are stacked on a substrate in a form of multi layers, has been suggested. Even though the flat surface area occupied by each of the memory cells is not decreased, the 3D semiconductor memory device may improve integration of the memory cells. Researches and development are required in various aspects in order to commercialize the 3D semiconductor memory device.

BRIEF SUMMARY

The present invention has been made in an effort to provide a semiconductor memory device capable of improving reliability and decreasing difficulty in a manufacturing process.

An exemplary implementation of the present invention provides a semiconductor memory device comprising a string including at least one drain select transistor, a plurality of first memory cells, a first connection element, a plurality of second memory cells, a second connection element, a plurality of third memory cells, and at least one source select transistor, wherein the at least one drain select transistor, the plurality of first memory cells, the plurality of second memory cells, the plurality of third memory cells, and the at least one source select transistor are connected serially via the first connection element and the second connection element.

Another exemplary implementation of the present invention provides a semiconductor memory device, including a first connection element; a first channel layer protruding from the first connection element in a first direction; first memory cells surrounding the first channel layer, the first memory cells being stacked along the first channel layer; at least one drain select transistor stacked over the first memory cells and surrounding the first channel layer; a second channel layer protruding from the first connection element its the first direction; second memory cells surrounding the second channel layer, the second memory cells being stacked along the second channel layer; a second connection element connected to the second channel layer; a third channel layer protruding from the second connection element in a second direction that is substantially opposite to the first direction; third memory cells surrounding the third channel layer, the third memory cells being stacked along the third channel layer; and at least one source select transistor surrounding the third channel layer, the at least one source select transistor being stacked at lower portions of the third memory cells.

Yet another exemplary implementation of the present invention provides a semiconductor memory device, including a first pipe gate; a common source line formed on the same level as the first pipe gate; a second pipe gate formed over the first pipe gate and the common source line; a bit line formed over the second pipe gate; first memory cells serially connected between the bit line and the first pipe gate; second memory cells serially connected between the first pipe gate and the second pipe gate; and third memory cells serially connected between the second pipe gate and the common source line.

The foregoing summary is illustrative only and is not intended to be in any way limiting. In addition to the illustrative aspects, exemplary implementations, and features described above, further aspects, exemplary implementations, and features will become apparent by reference to the drawings and the following detailed description.

BRIEF DESCRIPTION OF THE DRAWINGS

The above and other features and advantages of the present invention will become more apparent to those of ordinary skill in the art by describing in detail exemplary implementations thereof with reference to the attached drawings in which.

DETAILED DESCRIPTION

Figure 1:
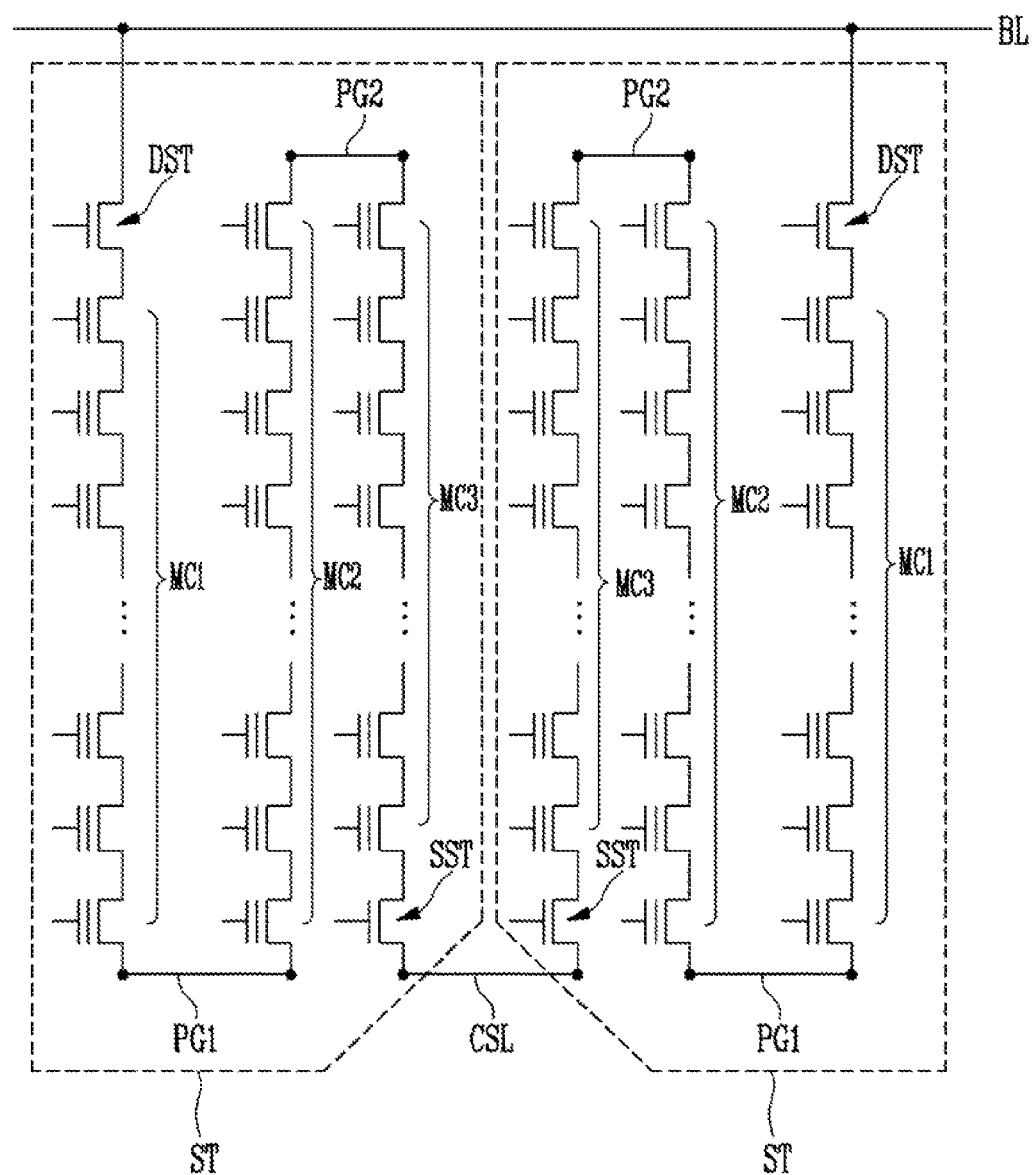
FIG. 1 is a circuit diagram of a semiconductor memory device according to a first exemplary implementation of the present invention.

Hereinafter, an exemplary implementation of the present invention will be described in detail with reference to the accompanying drawings. However, the present invention is not limited to an exemplary implementation disclosed below and may be implemented in various forms and the scope of the present invention is not limited to the following exemplary implementations.

In the drawings, the thicknesses and the intervals of elements are exaggerated for convenience of illustration, and may be exaggerated con pared to an actual physical thickness. In describing the present invention, a publicly known configuration irrelevant to the principal point of the present invention may be omitted. Throughout the disclosure, reference numerals correspond directly to the like numbered parts in the various figures and embodiments of the present invention. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a circuit diagram of a semiconductor memory device according to a first exemplary implementation of the present invention.

Referring to FIG. 1, the semiconductor memory device according to the first exemplary implementation of the present invention may include a bit line BL, a common source line CSL, and strings ST disposed between the bit line BL and the common source line CSL. The strings ST may be connected to the bit line BL and the common source line CSL. The strings ST may be symmetrically connected to the common source line CSL. For example, a first string connected to one side of the common source line CSL may be symmetric to a second string connected to the other side of the common source line CSL.

Each of the strings ST may include at least one drain select transistor DST, a plurality of first memory cells MC1, a first pipe gate PG1 that is a first connection element, a plurality of second memory cells MC2, a second pipe gate PG2 that is a second connection element, a plurality of third memory cells MC3, and at least one source select transistor SST. The drain select transistor DST, the plurality of first memory cells MC1, the first pipe gate PG1, the plurality of second memory cells MC2, the second pipe gate PG2, the plurality of third memory cells MC3 and source select transistor SST may be serially connected. The first and second pipe gates PG1 and PG2 may be conductive patterns. The first memory cells MC1 and the drain select transistor DST may be stacked between the first pipe gate PG1 and the second pipe gate PG2. The second memory cells MC2 may be stacked between the first pipe gate PG1 and the second pipe gate PG2. The source select transistor SST and the third memory cells MC3 may be stacked on a lower portion of the second pipe gate PG2. As described above, in the first exemplary implementation of the present invention, the string ST may be formed by serially connecting, via the first and second pipe gates PG1 and PG2, the first to third memory cells MC1, MC2, and MC3, which are stacked in different columns. The first and second pipe gates PG1 and PG2 are offset from one another and may be located below and above the first to third memory cells MC1, MC2, and MC3. Accordingly, in the first exemplary implementation of the present invention, it is possible to decrease a height of the string ST, thereby decreasing difficulty in a manufacturing process of the string ST.

Figure 2:
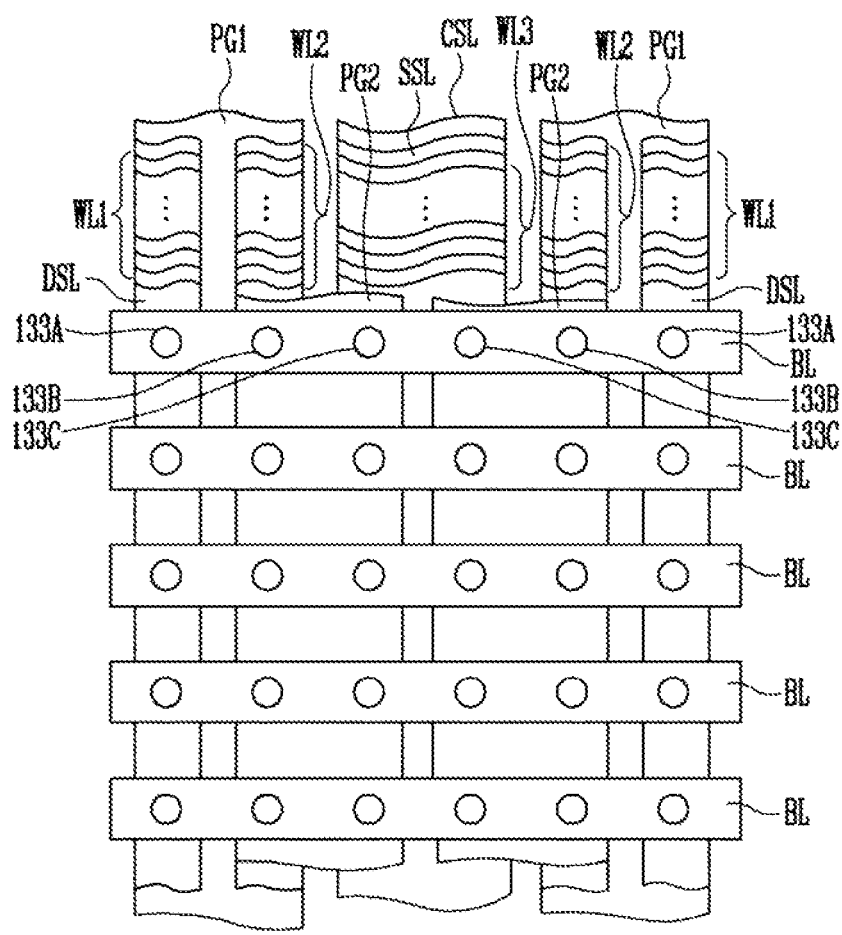
FIG. 2 is a plan view illustrating a line disposition of the semiconductor memory device according to the first exemplary implementation of the present invention.
Figure 3:
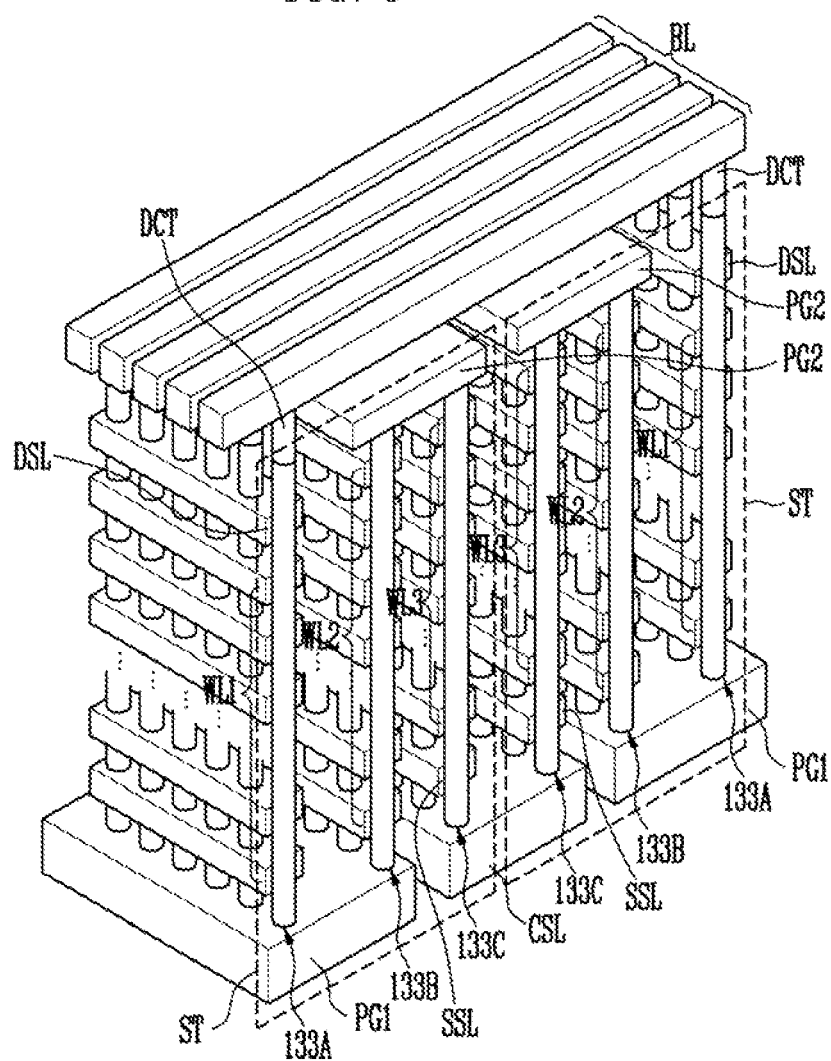
FIG. 3 is a perspective view of the semiconductor memory device according to the first exemplary implementation of the present invention.

FIG. 2 is a plan view illustrating a line disposition of the semiconductor memory device according to the first exemplary implementation of the present invention. FIG. 3 is a perspective view of the semiconductor memory device according to the first exemplary implementation of the present invention. Especially, FIGS. 2 and 3 are drawings illustrating a part of a memory cell array region. In FIG. 3, an illustration of an insulating layer is omitted for convenience of the description.

Referring to FIGS. 2 and 3, the first pipe gate PG1, first word lines WL1 connected to gates of the first memory cells MC1, the drain select line DSL connected to a gate of the drain select transistor DST, second word lines WL2 connected to gates of the second memory cells MC2, the second pipe gate PG2, third word lines WL3 connected to gates of the third memory cells MC2, the source select line SSL connected to a gate of the source select transistor SST, and the common source line CSL may be formed in a line form along in one direction within the memory cell array region.

The first pipe gate PG1 and the common source line CSL may be disposed on the same level. Accordingly, the common source line CSL may be simultaneously patterned with the first pipe gate PG1, thereby decreasing the number of mask processes.

The first word lines WL1 may be stacked on one side of the first pipe gate PG1. The drain select line DSL may be stacked on the first word lines WL1. The drain select lire DSL and the first word lines WL1 may be penetrated by a first through structure 133A.

A plurality of first through structures 133A may be formed in longitudinal directions of the first word lines WL1 and the drain select line DSL. The first through structure 133A may be connected between the first pipe gate PG1 and the bit line BL. A drain contact plug DCT may be further formed between the bit line BL and the first through structure 133A.

The second word lines WL2 may be stacked on the other side of the first pipe gate PG1. The second word lines WL2 may be penetrated by a second through structure 133B.

A plurality of second through structures 133B may be formed in longitudinal directions of the second word lines WL2. The second through structure 133B may be connected to the second pipe gate PG2.

The second pipe gate PG2 may be stacked on the second word lines WL2. One side of the second pipe gate PG2 may overlap the second word lines WL2.

The third word lines WL3 may be stacked on a lower portion of the other side of the second pipe gate PG2. The source select line SSL may be stacked on lower portions of the third word lines WL3. The third word lines WL3 and the source select line SSL may be penetrated by a third through structure 133C.

A plurality of third through structures $133c$ may be formed in longitudinal directions of the third word lines WL3 and the source select line SSL. The third through structure 133C may be connected between the second pipe gate PG2 and the common source line CSL.

The third word lines WL3 and the source select line SSL may be formed to have a wider width than those of the first and second word lines WL1 and WL2, and the drain select line DSL, so as to surround two columns of third through structures 133C, of the plurality of the plurality third through structures 133C.

A plurality of bit lines BL may be formed over the second pipe gate PG2. The bit lines BL may be formed in a line along a direction crossing the second pipe gate PG2 within the memory cell array region.

Each of the first to third through structures 133A to 133C may include a channel layer. The channel layer provides channel regions of the select transistor DST, the first to third memory cells MC1, MC2, and MC3, and the source select transistor SST. A multilayer, including a tunnel insulating layer, a data storing layer, or a blocking insulating layer, may be formed at an interface between each of the first to third word lines Wl1, WL2, and WL3 and the channel layer, an interface between the drain select line DSL and the channel layer, and an interface between the source select line SSL and the channel layer.

The tunnel insulating layer may surround a side wall of the channel layer, or may surround each of the first to third word lines WL1 to WL3, the drain select line DSL, and the source select line SSL.

The data storing layer may contact the tunnel insulating layer and surrounding the side wall of the channel layer, or may surround each of the first to third word lines WL1 to WL3, the drain select line DSL, and the source select line SSL.

The blocking insulating layer may contact the data storing layer and surround the side wall of the channel layer, or may surround each of the first to third word lines WL1 to WL3, the drain select line DSL, and the source select line SSL.

FIGS. 4A to 4D are cross-sectional views illustrating a method of manufacturing the semiconductor memory device according to the first exemplary implementation of the present invention.

Figure 4A:
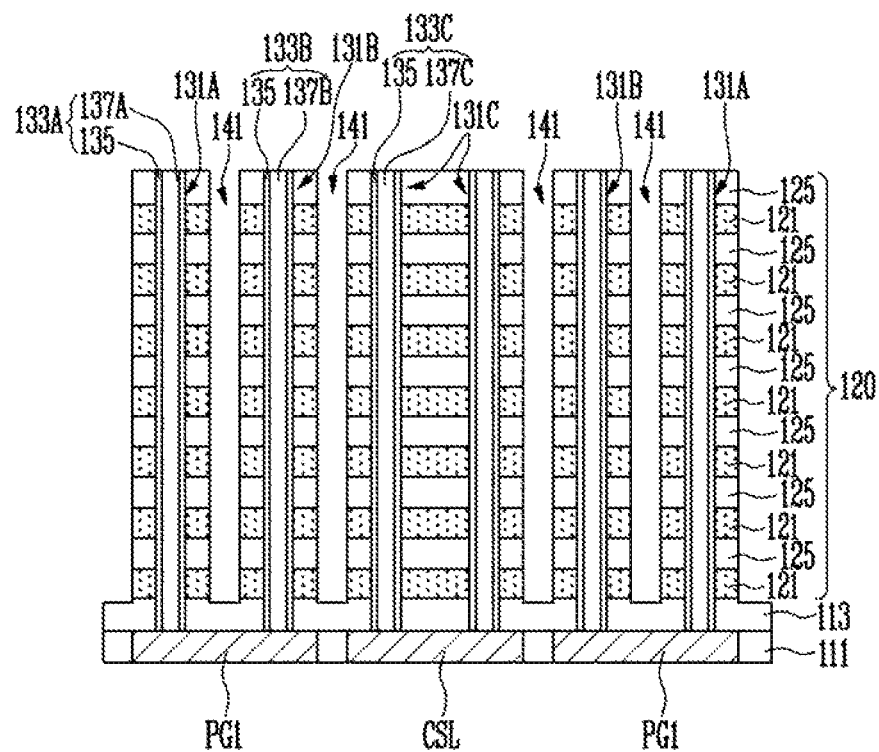
FIGS. 4A to 4D are cross-sectional views illustrating a method of manufacturing the semiconductor memory device according to the first exemplary implementation of the present invention.

Referring to FIG. 4A, the first pipe gate PG1 and the common source line CSL are formed. The first pipe gate PG1 and the common source line CSL may be formed on a semiconductor substrate (not shown) with a first interlayer insulating layer (not shown) interposed therebetween. The first pipe gate PG1 and the common source line CSL may be formed by forming a second interlayer insulating layer 111 on the first interlayer insulating layer, forming trenches by etching the second interlayer insulating layer 111, and filling insides the trenches with a conductive material. Alternatively, the first pipe gate PG1 and the common source line CSL may be formed by forming a conductive layer on the semiconductor substrate, and then pattering the conductive layer. In this case, after the first pipe gate PG1 and the common source line CSL are patterned, the second interlayer insulating layer 111 insulating the first pipe gate PG1 and the common source line CSL from each other may be formed. A plurality of first pipe gates PG1 may be formed. The common source line CSL may be disposed between the adjacent first pipe gates PG1.

Next, a third interlayer insulating layer 113 may be formed on the first pipe gate PG1, the common source line CSL, and the second interlayer insulating layer 111. A first material layer 121 and a second material layer 125 may be alternately stacked on the third interlayer insulating layer 113 to form a stacked structure 120. The first material layer 121 and the second material layer 125 may be formed of materials having different etching selectivities. Further, any one of the first and second material layers 121 and 125 may be a sacrificial layer. If the first material layer 121 is used as the sacrificial layer, then the second material layer 125 may be used as a fourth interlayer insulating layer. In this case, the first material layer 121 may be formed of a nitride layer, and the second material layer 125 may be formed of an oxide layer. Alternatively, if the second material layer 125 is used as the sacrificial layer, then the first material layer 121 may be used as a conductive layer for a gate. In this case, the second material layer 125 may be formed of an undoped polysilicon layer, and the first material layer 121 may be formed of a doped polysilicon layer. In the drawings below, for convenience of the description, a case where the first material layer 121 is used as the sacrificial layer, and the second material layer 125 is used as the fourth interlayer insulating layer is described as an example. In the above description, the number of stacked first material layers 121 and second material layers 125 may be smaller than the number of memory cells forming the string desired to be formed. That is, a height of the stacked structure 120 is formed to be smaller than a length of the string desired to be formed, and more particularly, the height of the stacked structure 120 is formed by about ⅓ of the length of the string desired to be farmed.

After the forming of the stacked structure 120, first to third holes 131A, 131B, and 131C, which pass through the stacked structure 120 and the third interlayer insulating layer 113, may be formed by etching the stacked structure 120 and the third interlayer insulating layer 113 using a mask process. The first hole 131A may open one side of the first pipe gate PG1, the second hole 131B may open the other side of the first pipe gate PG1, and the third hole 131C may open the common source line CSL. The third hole 131C may be formed at both sides of the common source line CSL adjacent to the second hole 131B. The height of the stacked structure 120 may be decreased to, for example, ⅓ of the length of the string, so that it is possible to decrease difficulty in an etching process for forming the first to third holes 131A, 131B, and 131C, and secure an etching margin. Further, the etching margin is secured, so that it is possible to decrease widths of the first to third holes 131A, 131B, and 131C. Thus, it is possible to decrease a size of the semiconductor memory device by decreasing a surface area occupied by the semiconductor memory device.

After the first to third holes 131A, 13B, and 131C are formed, the first to third through structures 133A, 133B, and 133C filled in the first to third holes 131A, 131B, and 131C may be formed. The first to third through structures 133A, 133B, and 133C include channel layers 137A, 137B, and 137C, respectively. Hereinafter, for convenience of the description, the channel layers 137A, 137B, and 137C are divided into the first channel layer 137A inside the first hole 131A, the second channel layer 137B inside the second hole 131B, and the third channel layer 137C inside the third hole 131C. The first to third channel layers 137A, 137B, and 137C may be formed of semiconductor layer, for example, a silicon layer. The first to third channel layers 137A, 137B, and 137C open center regions of the first to third holes 131A, 131B, and 131C, and may be formed along side walls of the first to third holes 131A, 131B, and 131C, or may be formed so as to fill the first to third holes 131A, 131B, and 131C. If the center region of the first to third holes 131A, 131B, and 131C are opened, then the center regions of the first to third holes 131A, 131B, and 131C may be filled with an insulating material. According to the aforementioned process, the first and second channel layers 137A and 137B have a structure upwardly protruding from the first pipe gate PG1. Further, the third channel layer 137C has a structure protruding from an upper portion of the common source line CRL.

Before the forming of the first to third channel layers 137A, 137B and 137C, a thin film 135 may be formed along the side walls of the first to third holes 131A, 131B, and 131C. The thin film 135 may be a single layer formed of the tunnel insulating layer, a multilayer formed of the data storing layer and the tunnel insulating layer, or a multilayer including the blocking insulating layer, the data storing layer, and the tunnel insulating layer. The tunnel insulating layer may be formed of a silicon oxide layer, the data storing layer may be a silicon nitride layer in which the charge trap is possible, and the blocking insulating layer may be an oxide layer.

Next, a slit 141, which penetrates the stacked structure 120 between the first and second through structures 133A and 133B, and the second and third through structures 133B and 133C, may be formed by etching the stacked structure 120. Alternatively, although it is not shown, the slit 141 may also be further formed between adjacent third through structures 133C. The slit 141 exposes the side walls of the first and second material layers 121 and 125.

Figure 4B:
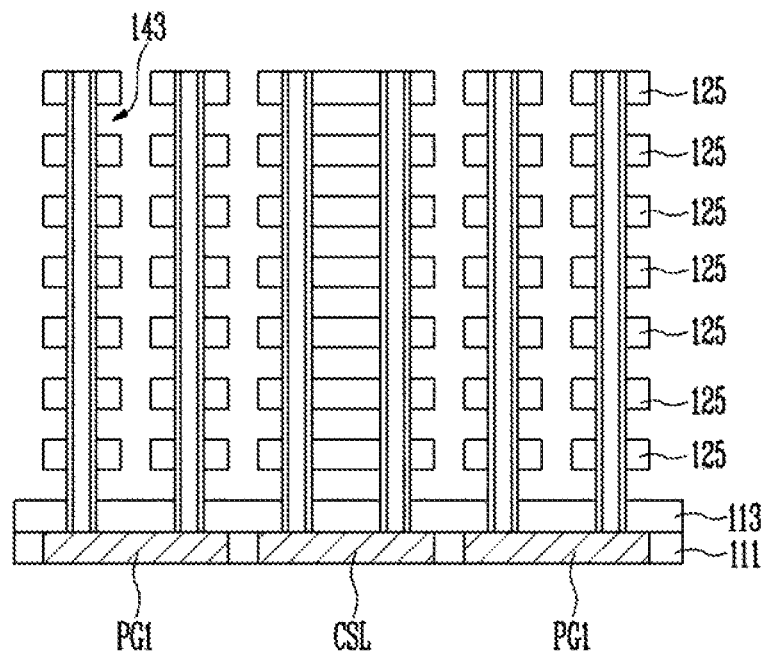

Referring to FIG. 4B, a recess region 143 may be formed by selectively removing the first material layer 121 and the second material layer 125 exposed through the slit 141. For example, the recess region 143 is formed by removing the first material layer 121 through the slit 141.

Figure 4C:
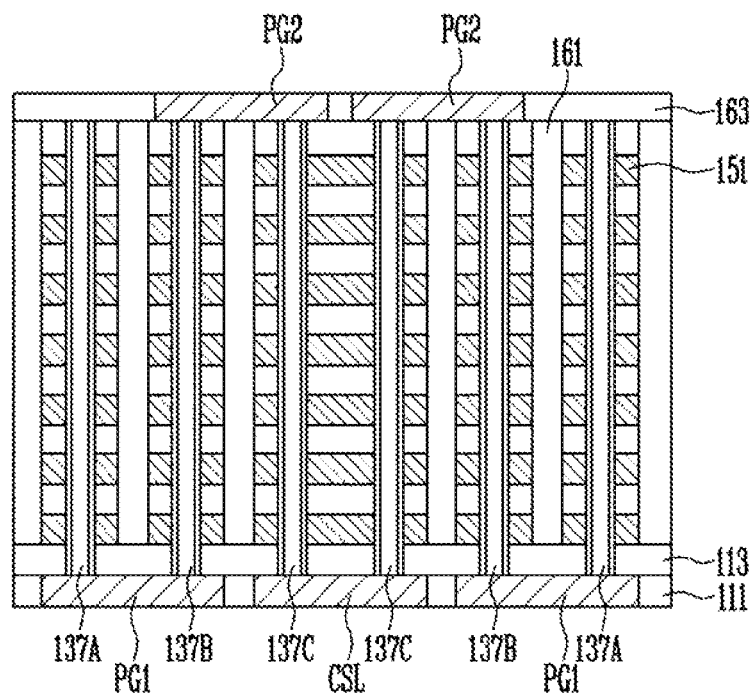

Referring to FIG. 4C the conductive patterns 151 may be formed by filling the recess region 143 with a conductive material. The conductive patterns 151 may be used as the first to third word lines WL1, WL2, and WL3, the source select line SSL, and the drain select line DSL aforementioned with reference to FIGS. 2 and 3. If the thin film 131 is not formed before the forming of the first to third channel layers 137A, 137B, and 137C in the process described with reference to FIG. 4A, then the thin film 135 described with reference to FIG. 4A may be formed along a surface of the recess region 143 before the forming of the conductive patterns 151. Accordingly, the multilayer including the blocking insulating layer, the data storing layer, and the tunnel insulating layer may be disposed on the interfaces between the first to third channel layers 137A, 137B, and 137C, and the conductive patterns 151.

Alternatively, if the recess region is formed by removing the second material layer 125, the recess region may be filled with an insulating material for the fourth interlayer insulating layer.

After the recess region is filled with the conductive material or the insulating material, the slit 141 may be filled with an insulating layer 161, and the second pipe gate PG2 connecting the second and third channel layers 137B and 137B may be formed on the second and third channel layers 137B and 137C. Accordingly, the second and third channel layers 137B and 137C have a structure protruding downwardly from the second pipe gate PG2. The second pipe gate PG2 may be formed by forming a fifth interlayer insulating layer 163, forming trenches by etching the fifth interlayer insulating layer 163, and filling insides of the trenches with a conductive layer. Alternatively, the second pipe gate PG2 may be formed by forming a conductive layer and then patterning the conductive layer. In this case, the second pipe gate PG2 is patterned into a plurality of second pipe gates PG2, and then the fifth interlayer insulating layer 163 insulating the second pipe gates PG2 from each other may be formed.

Figure 4D:
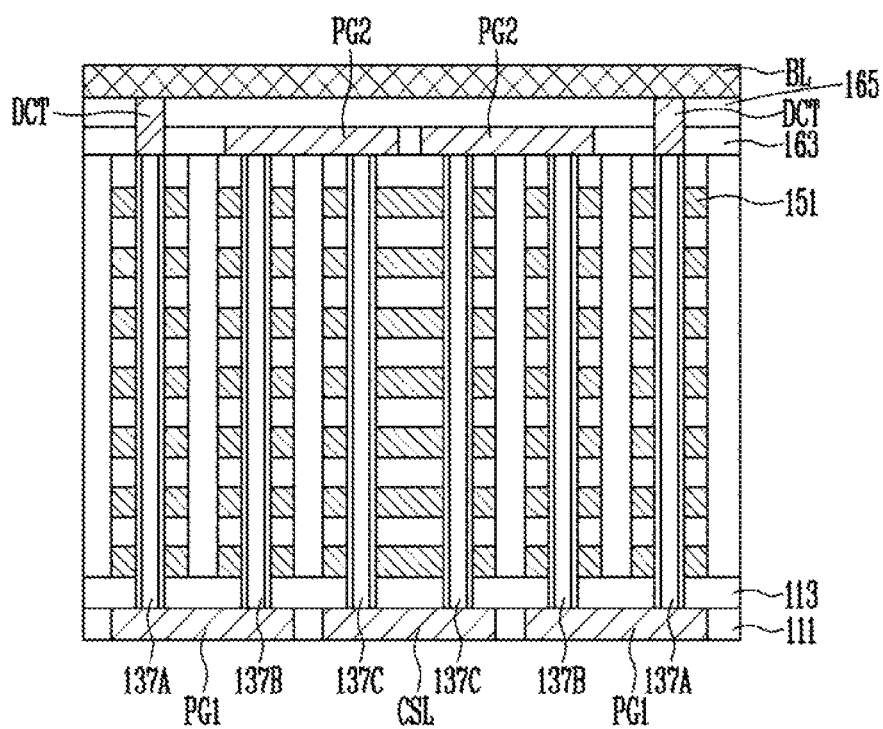

Referring to FIG. 4D, a sixth interlayer insulating layer 165 may be formed on the second pipe gates PG2 and the fifth interlayer insulating layer 163. Then, a contact hole, which passes through the sixth interlayer insulating layer 165 and the fifth interlayer insulating layer 163, may be formed. Next, a drain contact plug DCT, which is connected to the first channel layer 137A, may be formed by filling the contact hole with a conductive material.

Then, a bit line BL, which is connected to the drain contact plug DCT, may be is formed on the drain contact plug DCT. The bit line BL may be formed by forming a seventh interlayer insulating layer (not shown), forming trenches by etching the seventh interlayer insulating layer, and then filling insides of the trenches with a conductive material. Alternatively, the bit line BL may be formed by forming a conductive layer and then patterning the conductive layer.

Figure 5:
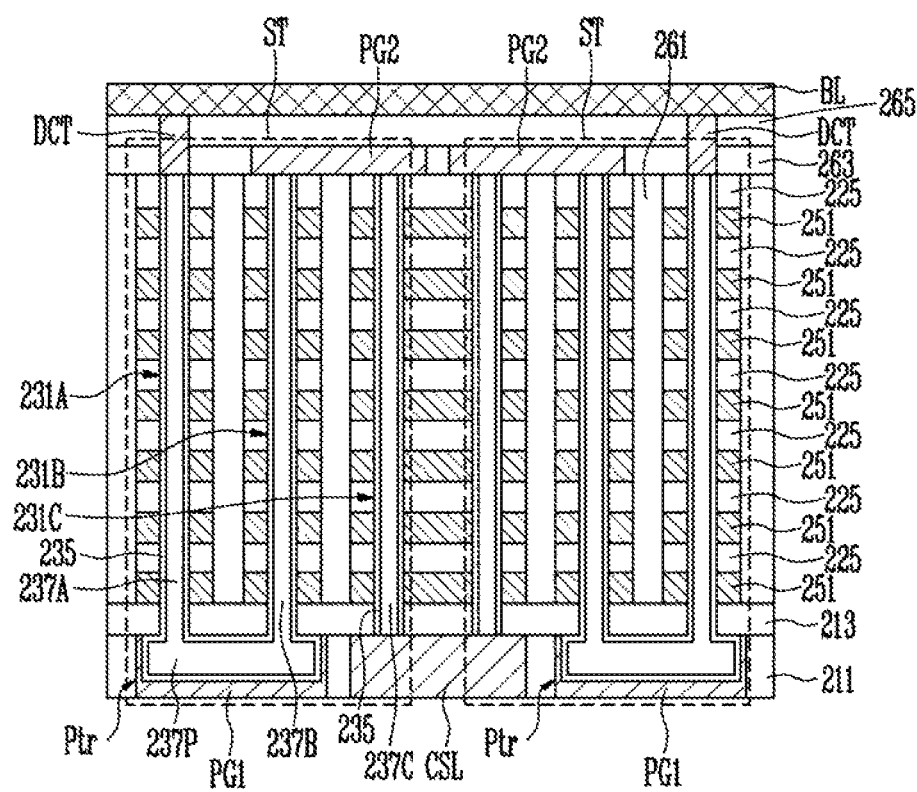
FIG. 5 is a cross-sectional view of a semiconductor memory device according to a second exemplary implementation of the present invention.

FIG. 5 is a cross-sectional view of a semiconductor memory device according to a second exemplary implementation of the present invention.

Referring to FIG. 5, the semiconductor memory device according to the second exemplary implementation of the present invention may include a bit line BL, a common source line CSL, and strings ST disposed between the bit line BL and the common source line CSL. The strings ST may be connected to the bit line BL and the common source line CSL. The strings ST may be symmetrically connected to the common source line CSL. For example, a first string connected to one side of the common source line CSL may be symmetric to a second string connected to the other side of the con non source line CSL.

Each of the strings ST according to the second exemplary implementation of the present invention may include a pipe transistor Ptr, which is a first connection element, first and second channel layers 237A and 237B connected to a pipe channel layer 237P of the pipe transistor Ptr to be extended in an upper direction, a second pipe gate PG2, which is a second connection element, connected on the second channel layer 237B, a third channel layer 237C connected to a lower portion of the second pipe gate PG2 to be formed to be parallel to the second channel layer 237B, and conductive patterns 251 and interlayer insulating layers 225 alternately stacked while surrounding each of the first to third channel layers 237A, 237B, and 237C. A thin film 235 may be further formed on interfaces between the first to third channel layers 237A, 237B, and 237C and the conductive patterns 251.

The pipe transistor Ptr may include the first pipe gate PG2, the pipe channel layer 237P formed inside the first pipe gate PG2, and the thin film 235 extended to the interface between the pipe channel layer 237P and the second pipe gate PG2. The pipe transistor Ptr may be formed on the same level as the common source line CSL. The first pipe gate PG1 of the pipe transistor Ptr and the common source line CSL may be formed on the same level, and may be simultaneously patterned. Accordingly, in the second exemplary implementation of the present invention, it is possible to omit a separate mask process for forming the common source line CSL, thereby decreasing the number of mask processes.

At least one conductive pattern from a topmost layer among the conductive patterns 251 surrounding a first channel layer 237A may be a drain select line connected to a gate of the drain select transistor. Lower conductive patterns may be first word lines connected to gates of first memory cells. The first memory cells and the drain select transistor are stacked on the first connection element along the first channel layer 237A, similar to the first exemplary implementation. However, the first connection element of the first exemplary implementation of the present invention is the first pipe gate that is the conductive pattern, but the first connection element of the second exemplary implementation of the present invention is the pipe transistor Ptr having a transistor structure.

The conductive patterns 251 surrounding the second channel layer 237B may be second word lines connected to gates of second memory cells. The second memory cells may be stacked between the first connection element and the second connection element along the second channel layer 237B, similar to the first exemplary implementation. The first connection element according to the second exemplary implementation of the present invention is the pipe transistor Ptr, and the second connection element is the second pipe gate PG2.

At least one conductive pattern from a bottommost layer among the conductive patterns 251 surrounding the third channel layer 237C may be a source select line connected to a gate of the source select transistor. Conductive patterns on the source select line may be third word lines connected to gates of third memory cells. The third memory cells and the source select transistor are stacked on a lower portion of the second pipe gate PG2 along the third channel layer 237C, substantially similar to the first exemplary implementation. As described above, in the second exemplary implementation of the present invention, the string ST may be formed by serially connecting, via the pipe transistor Ptr and the second pipe gate PG2, the first to third memory cells, which are stacked on different columns. The pipe transistor Ptr and the second pipe gate PG2 are offset from one another and may be located below and above the first to third memory cells. Accordingly, in the second exemplary implementation of the present invention, it is possible to decrease a height of the string ST, thereby decreasing difficulty in a manufacturing process of the string ST.

The layout of the first pipe gate PG1, the conductive patterns 251, the common source line CSL, and the bit line BL of the semiconductor memory device according to the second exemplary implementation of the present invention is the same as that described with reference to FIGS. 2 and 3. The bit line BL according to the second exemplary implementation of the present invention is connected to the first channel layer 237A through a drain contact plug DCT like the first exemplary implementation.

Hereinafter, a method of manufacturing the semiconductor memory device according to the second exemplary implementation of the present invention will be described.

First, the first pipe gate PG1, a common source line CSL, and a second interlayer insulating layer 211 may be formed on a first interlayer insulating layer (not shown) of a semiconductor substrate (not shown) by a process substantially similar to that described with reference to FIG. 4A.

Then, a trench may be formed inside the first pipe gate PG1 by etching the first pipe gate PG1. The trench may be filled with a sacrificial layer. Next, a third interlayer insulating layer 213 may be formed.

Then, as described in FIG. 4A, a stacked structure may be formed by alternately stacking a first material layer (not shown) and a second material layer 225 on the third interlayer insulating layer 213. First and second holes 231A and 231B, which pass through the stacked structure to open the sacrificial layer, may be formed inside the first pipe gate PG1, and a third hole 231C, which opens the common source line CSL may be formed. Next, the sacrificial layer inside the first pipe gate PG1 may be removed.

After removing the sacrificial layer inside the first pipe gate PG1, as described with reference to FIG. 4A, the thin film 235 and a semiconductor layer may be formed inside the trench of the first pipe gate PG1, as well as the first to third holes 231A to 231C. In this case, the semiconductor layer formed inside the first pipe gate PG1 may be a pipe channel layer 237P, the semiconductor layer formed inside the first hole 231A may be a first channel layer 237A, the semiconductor layer formed inside the second hole 231B may be a second channel layer 237B, and the semiconductor layer formed inside the third hole 231C may be a third channel layer 237C.

Subsequently, a slit forming process, an insulating layer 261 forming process, a conductive pattern 251 forming process, a second pipe gate PG2 forming process, a fifth interlayer insulating layer 263 forming process, a sixth interlayer insulating layer 265 forming process, a drain contact plug DCT forming process, and a bit line BL forming process are performed. These processes may be substantially similar to the processes discussed above with respect to the first exemplary implementation.

In an alternative implementation, the second connection elements of the first and second exemplary implementations may be substituted with a pipe transistor having a transistor structure.

Figure 6:
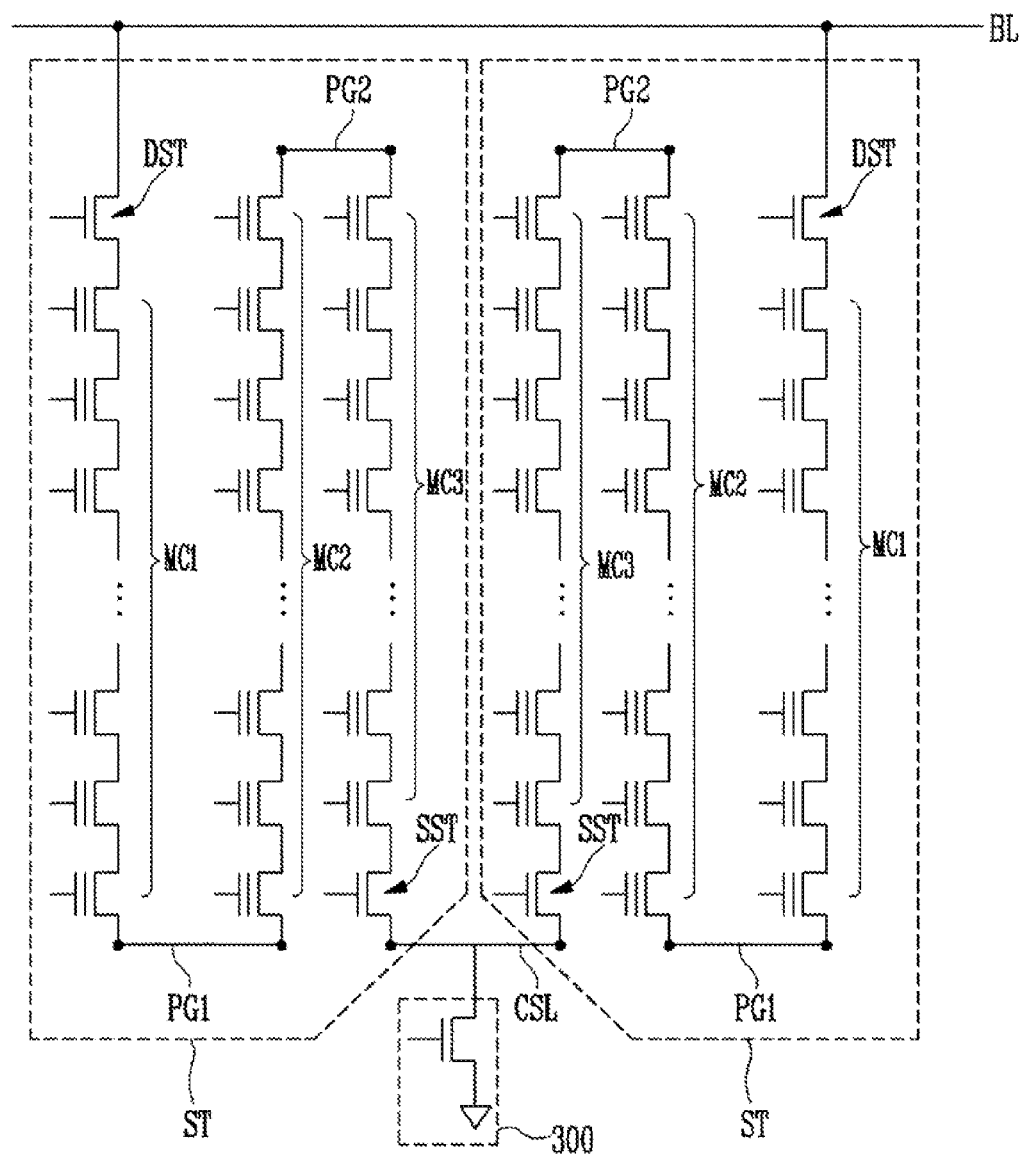
FIG. 6 is circuit diagram of a semiconductor memory device according to a third exemplary implementation of the present invention.

FIG. 6 is a circuit diagram of a semiconductor memory device according to a third exemplary implementation of the present invention.

Referring to FIG. 6 the semiconductor memory device according to the third exemplary implementation of the present invention may include a bit line BL, a common source line CSL, and strings ST disposed between the bit line BL and the common source line CSL. The strings ST may be connected to the bit line BL and the common source line CSL. The strings ST may be symmetrically connected to the common source line CSL. For example, a first string connected to one side of the common source line CSL may be symmetric to a second string connected to the other side of the common source line CSL. A structure of each string ST may be substantially similar to that described with reference to FIG. 1.

In the third exemplary implementation of the present invention, a discharge circuit 300, which may be connected to a lower portion of a common source line CSL, may be further included for a discharge operation of the common source line CSL. The discharge circuit 300 may be a transistor in which a drain is connected to the common source line CSL, a source is connected to a ground terminal, or a gate is connected to a gate voltage supply terminal to which an on/off voltage is applied.

In the third exemplary implementation of the present invention, the discharge circuit 300 of the common source line CSL may be formed at a lower portion of the common source line CSL, so that it is possible to decrease a distance between the common source line CSL and the discharge circuit 300. Accordingly, in the third exemplary implementation of the present invention, it is possible to improve reliability of an operation of a 3D semiconductor memory device by decreasing resistance of a connection portion of the common source line CSL and the discharge circuit 300.

Figure 7:
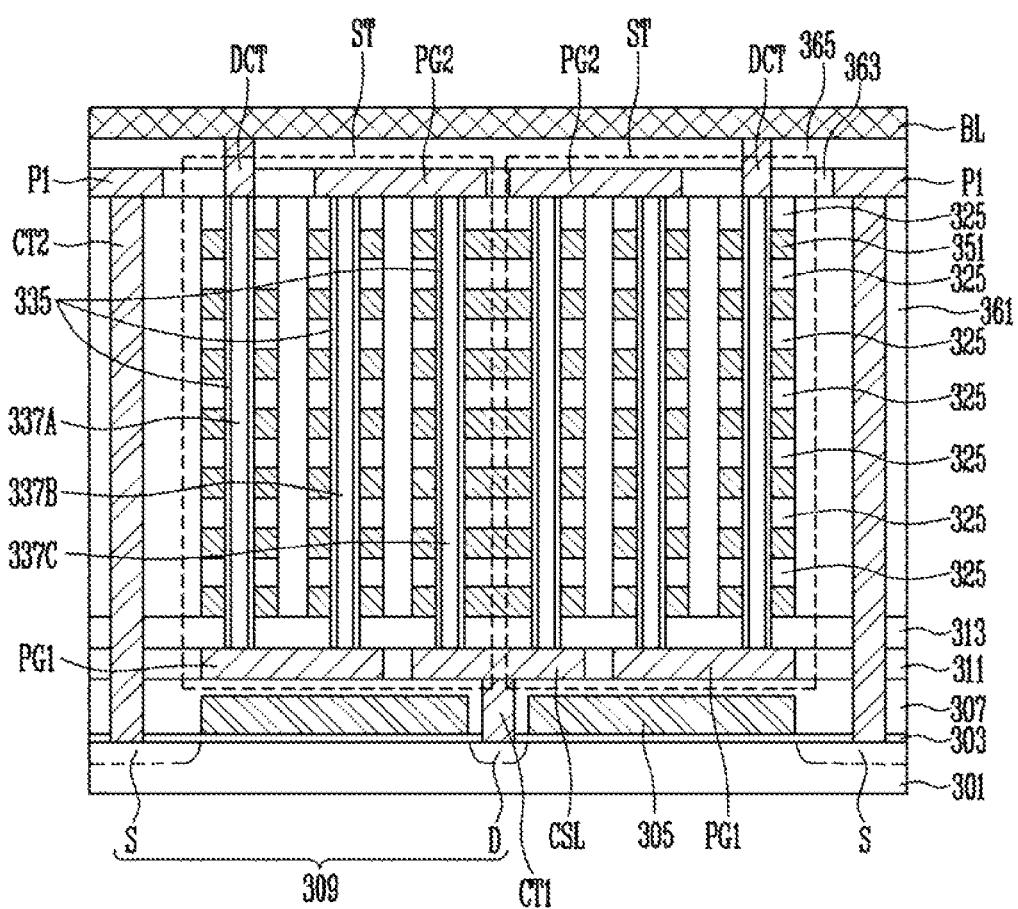
FIG. 7 is a cross-sectional view of the semiconductor memory device according to the third exemplary implementation of the present invention.

FIG. 7 is a cross-sectional view of the semiconductor memory device according to the third exemplary implementation of the present invention.

Referring to FIG. 7, the semiconductor memory device according to the third exemplary implementation of the present invention may include a transistor 309 connected to the lower portion of the common source line CSL. The transistor 309 may include a gate insulating layer 303 formed on a semiconductor substrate 301, a gate 305 formed on the gate insulating layer 303, a drain D formed by injecting an impurity in the semiconductor substrate 301 at one side of the gate 305, and a source S formed by injecting an impurity to the semiconductor substrate 301 at the other side of the gate 309. The gate 305 may be divided at the lower portion of the common source line CSL.

The common source line CSL and the transistor 309 may be connected with each other through a first contact plug CT1 formed between the drain D of the transistor 309 and the common source line CSL.

The source S of the transistor 309 may be electrically connected to a ground terminal through a second contact plug CT2 connected to an upper portion of the source S to be extended in a vertical direction with respect to the semiconductor substrate 301, and a connection pattern P1 connected on the second contact plug CT2 and connected to the ground terminal (not shown). The second contact plug CT2 may be formed on a memory block boundary.

A structure of the string ST of the semiconductor memory device according to the third exemplary implementation of the present invention may be similar to that of the first exemplary implementation of the present invention.

Hereinafter, a method of manufacturing the semiconductor memory device according to the third exemplary implementation of the present invention will be described.

First, a gate insulating layer 303 may be formed on a semiconductor substrate 301. Then, a gate 305 may be formed by depositing a conductive layer on the gate insulating layer 303, and patterning the conductive layer. Next, a source S and a drain D may be formed by injecting an impurity into the semiconductor substrate 301 at both sides of the gate 305 by using the gate 305 as a mask. Accordingly, a transistor 305 for discharging the common source line CSL may be formed.

Then, a first interlayer insulating layer 307, which covers the transistor 305, may be formed, and the first contact plug CT2, which is connected to the drain D of the transistor 305 and passes through the first interlayer insulating layer 307, may be formed.

Then, the first pipe gate PG1, a common source line CSL, and a second interlayer insulating layer 311 may be formed on the first interlayer insulating layer by a process substantially similar to that described with reference to FIG. 4A. In this case, the common source line CSL may be formed to be connected to the first contact plug CT2.

Then, a third interlayer insulating layer 313 stacked structure, a thin film 335, first to third channel layers 337A, 337B, and 337C, and a slit may be formed by a process substantially to similar to that described with reference to FIG. 4A.

Next, a conductive pattern 351 or a fourth interlayer insulating layer 325 may be formed by a process substantially similar to that described with reference to FIGS. 4B and 4C. Then, an insulating layer 361 may be formed by a process substantially similar to that described with reference to FIG. 4C.

After the insulating layer 361 is formed, a second contact plug CT2, which passes through the insulating layer 361, the first to third interlayer insulating layers 307, 311, and 313, and the gate insulating layer 303 to be connected to the source S of the transistor 309, may be formed.

Then, a second pipe gate PG2 and a fifth interlayer insulating layer 363 may be formed by a process similar to that described with reference to FIG. 4C. When the second pipe gate PG2 is formed, a connection pattern P1, which is connected to the second contact plug CT2, may be formed by the same conductive layer as that of the second pipe gate PG2.

Next, a sixth interlayer insulating layer 365, a drain contact plug DCT, and a bit line BL may be formed by a process similar to that described with reference to FIG. 4D.

Although it is not shown, at least one of the first and second connection elements of the third exemplary implementation may be substituted with a pipe transistor having a transistor structure.

Figure 8:
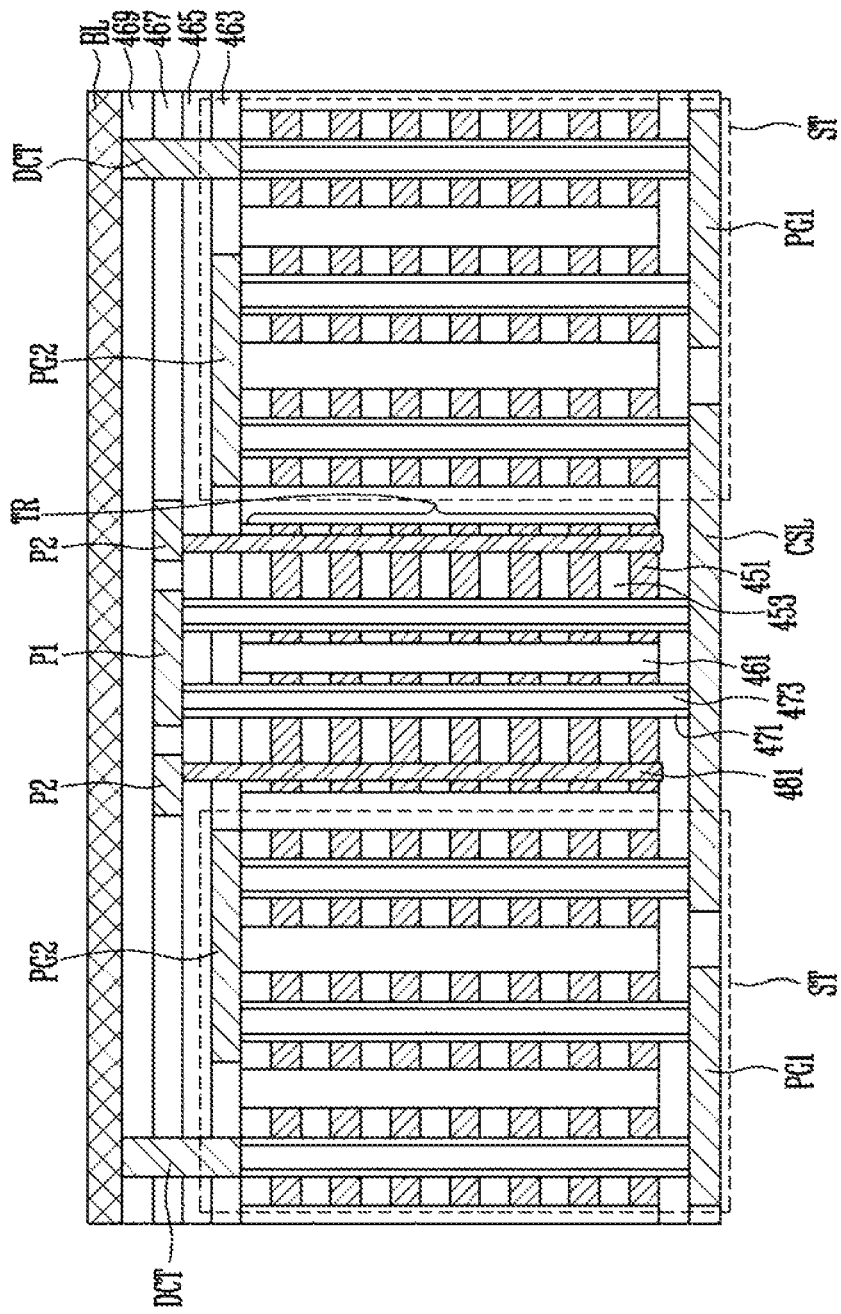
FIG. 8 is a cross-sectional view of a semiconductor memory device according to a fourth exemplary implementation of the present invention.

FIG. 8 is a cross-sectional view of a semiconductor memory device according to a fourth exemplary implementation of the present invention.

Referring to FIG. 8, the semiconductor memory device according to the fourth exemplary implementation of the present invention may include a bit line BL, a common source line CSL, and strings ST disposed between the bit line BL and the common source line CSL. The strings ST may be connected to the bit line BL and the common source line CSL. The strings ST may be symmetrically connected to the common source line CSL. For example, a first string connected to one side of the common source line CSL may be symmetric with a second string connected to the other side of the common source line CSL. A structure of the string ST according to the fourth exemplary implementation of the present invention may be substantially similar to that of the first exemplary implementation of the present invention.

The semiconductor memory device according to the fourth exemplary implementation of the present invention further may include a plurality of transistors TR stacked on the common source line CSL to be connected to the common source line CSL.

The plurality of transistors TR may form a discharge circuit for a discharge operation of the common source line CSL. The plurality of transistors TR may include gate patterns 451 stacked on the common source line CSL, a fourth channel layer 473, which passes through the gate patterns 451 and has a lower end connected to the common source line CSL, a gate insulating layer 471 formed between the gate patterns 451 and the fourth channel layer 473, while surrounding a side wall of the fourth channel layer 473. The fourth channel layer 473 may be connected to a first connection pattern P1 connected to a ground terminal (not shown) to be electrically connected to the ground terminal. A fourth interlayer insulating layer 453 may be formed between the adjacent gate patterns 451.

The gate patterns 451 and the fourth interlayer insulating layer 453 may be penetrated by a contact plug 481. An upper end of the contact plug 481 may be connected to the second connection pattern P2 connected to a gate voltage supply terminal (not shown) to be electrically connected to the gate voltage supply terminal. Accordingly, the gate patterns 451 may be commonly connected to the gate voltage supply terminal through the contact plug 481.

In the fourth exemplary implementation of the present invention, a discharge circuit of the common source line CSL may be formed on the common source line CSL, so that it is possible to decrease a distance between the common source line CSL and the discharge circuit. Accordingly, in the fourth exemplary implementation of the present invention, it is possible to improve reliability of an operation of a 3D semiconductor memory device by decreasing resistance of a connection portion of the common source line CSL and the discharge circuit.

A structure of the string ST of the semiconductor memory device according to the fourth exemplary implementation of the present invention may be substantially similar to that of the first exemplary implementation of the present invention. The plurality of strings ST of the semiconductor memory device according to the fourth exemplary implementation of the present invention may be formed in a symmetric structure with the plurality of transistors TR interposed therebetween.

Hereinafter, a method of manufacturing the semiconductor memory device according to the fourth exemplary implementation of the present invention will be described.

In a manufacturing process of the semiconductor memory device according to the fourth exemplary implementation of the present invention, the manufacturing process according to the first exemplary implementation of the present invention is modified in order to form a plurality of transistors TR. More particularly, a plurality of processes from a process of forming a common source line CSL to a process of forming a slit may be substantially similar to those described with reference to FIG. 4A. However, during the process of forming the slit, a stacked structure may be etched so that the stacked structure (see reference numeral 120 of FIG. 4A) remains on the common source line CSL.

Then, when at least one of first and second material layers of the stacked structure is selectively removed by the same process as the process of forming the recess described with reference to FIG. 4B, a recess region may also be formed in the stacked structure remaining on the common source line CSL. Next, when the recess region is filled with a predetermined material, a gate pattern 451 and a fourth interlayer insulating layer 453 may be alternately stacked on the common source line CSL.

Then, the slit is filled with an insulating layer 461, and a second pipe gate PG2 and a fifth interlayer insulating layer 463 may be formed by a process substantially similar to that described with reference to FIG. 4C. Next, a sixth interlayer insulating layer 465 may be formed, and a channel holes, which pass through the sixth interlayer insulating layer 464, the fifth interlayer insulating layer 463, the gate patterns 451, and the fourth interlayer insulating layer s 453 to reach the common source line CSL, may be formed. Then, the gate insulating layer 471 may be formed on a side wall of the channel hole, and an inside of the channel hole may be filled with a fourth channel layer 473. The gate insulating layer 471 may be formed of a silicon oxide layer, and the fourth channel layer 473 may be formed of a semiconductor layer.

Next, a contact hole, which passes through the sixth interlayer insulating layer 465, the fifth interlayer insulating layer 463, the gate patterns 451, and the fourth interlayer insulating layers 453, may be formed. The gate patterns 451 may be exposed through a sidewall of the contact hole. Then, a contact plug 481, commonly connected to the gate patterns 451, may be formed by filling the contact hole with a conductive material.

Next, the seventh interlayer insulating layer 467 may be formed on the contact plug 481, the fourth channel layer 473, and the sixth interlayer insulating layer 465. Next, a first connection pattern P1, which is connected to the fourth channel layer 473, and a second connection pattern P2, which is connected to the contact plug 481, may be formed by forming trenches in the seventh interlayer insulating layer 467 and filling the trenches with a conductive material. Alternatively, the first and second connection patterns P1 and P2 may be formed by patterning the conductive layer, and then filling a space between the first and second connection patterns P1 and P2 with the seventh interlayer insulating layer 467.

Next, an eighth interlayer insulating layer 469 may be formed on the first and second connection patterns P1 and P2, and the seventh interlayer insulating layer 465. A drain contact plug DCT may be formed to pass through the eighth interlayer insulating layer 469, the seventh interlayer insulating layer 467, the sixth interlayer insulating layer 465, and the fifth interlayer insulating layer 463 to be connected to the string ST. Then, a bit line BL may be formed on the drain contact plug DCT.

Although it is not shown, at least one of the first and second connection elements of the fourth exemplary implementation may be substituted with a pipe transistor having a transistor structure.

Figure 9:
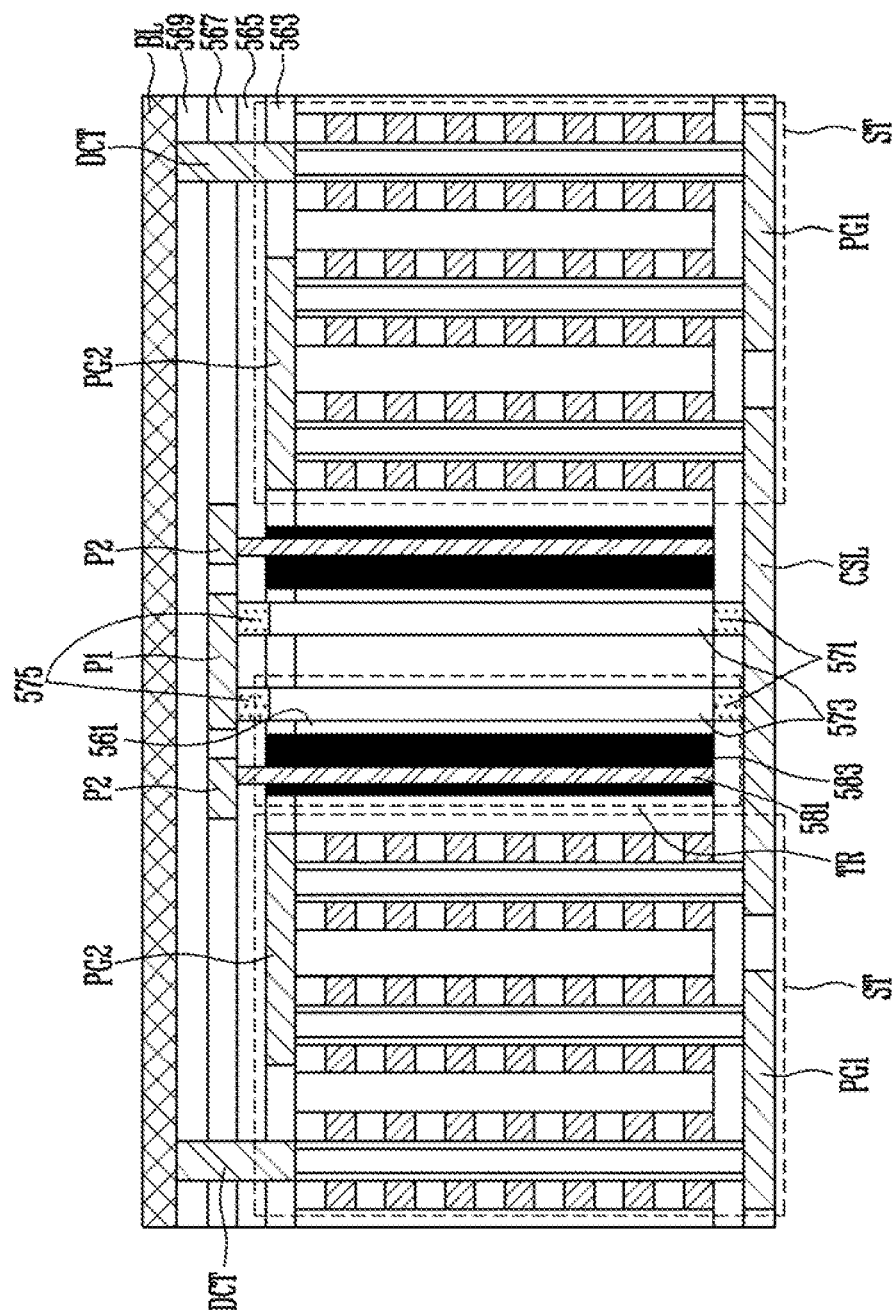
FIG. 9 is a cross-sectional view of a semiconductor memory device according to a fifth exemplary implementation of the present invention.

FIG. 9 is a cross-sectional view of a semiconductor memory device according to a fifth exemplary implementation of the present invention.

Referring to FIG. 9, the semiconductor memory device according to the fifth exemplary implementation of the present invention may include a bit line BL, a common source line CSL, and strings ST disposed between the bit line BL and the common source line CSL. The strings ST may be connected to the bit line BL and the common source line CSL. The strings ST may be symmetrically connected to the common source line CSL. For example, a first string connected to one side of the common source line CSL may be symmetric with a second string connected to the other side of the common source line CSL. A structure of the string ST according to the fifth exemplary implementation of the present invention is substantially similar to that of the first exemplary implementation of the present invention.

The semiconductor memory device according to the fifth exemplary implementation of the present invention further may include a transistor TR stacked on the common source line CSL to be connected to the common source line CSL.

The transistor TR forms a discharge circuit for a discharge operation of the common source line CSL. The transistor TR may include a vertical gate 583 spaced apart from the common source line CSL and formed on the common source line CSL, a fourth channel layer 573 disposed in parallel to the vertical gate 583, a drain layer 571 connected between the fourth channel layer 573 and the common source line CSL, and a source layer 575 connected on the fourth channel layer 573. An upper end of the source layer 575 may be connected to a first connection pattern P1 connected to a ground terminal (not shown) to be electrically connected to the ground terminal. The source layer 575 and the drain layer 571 may be formed of a doped polysilicon layer.

The vertical gate 583 may be penetrated by a contact plug 581. An upper end of the contact plug 581 may be connected to the second connection pattern P2 connected to a gate voltage supply terminal (not shown) to be electrically connected to the gate voltage supply terminal. Accordingly, the vertical gate 583 may be connected to the gate voltage supply terminal through the contact plug 581.

A structure of the string ST of the semiconductor memory device according to the fifth exemplary implementation of the present invention may be substantially similar to that of the first exemplary implementation of the present invention. The strings ST of the semiconductor memory device according to the fifth exemplary implementation of the present invention may be formed in a symmetric structure with the vertical gate 583 and the fourth channel layer 573 interposed therebetween.

Hereinafter, a method of manufacturing the semiconductor memory device according to the fifth exemplary implementation of the present invention will be described.

A process of manufacturing the semiconductor memory device according to the fifth exemplary implementation of the present invention is performed by modifying the process of manufacturing the semiconductor memory device according to the first exemplary implementation of the present invention. More particularly, the semiconductor memory device according to the fifth exemplary implementation may be formed via processes substantially similar to those described with reference to FIG. 4A. However, during the process of forming the slit, a stacked structure on the common source line CSL is etched so that the stacked structure (see reference numeral 120 of FIG. 4A) formed on the common source line CSL may be separated.

Then, the plurality of processes, from the process of forming the recess to processes of forming a second pipe gate PG2 and a fifth interlayer insulating layer 563, are performed substantially similar to those described with reference to FIGS. 4B and 4C.

Next, a vertical gate 583 may be formed to extend and to be spaced apart from the common source line CSL by a predetermined distance while passing through the fifth interlayer insulating layer 563. Then, a sixth interlayer insulating layer 565 may be formed, and a hole, which passes through the sixth interlayer insulating layer 565 and which extends to an upper surface of the common source line CSL, may be formed. Then, a source layer 571, a fourth channel layer 573, and a drain layer 575 may be sequentially formed within the hole.

Next, a contact plug 581, which passes through the sixth interlayer insulating layer 565 to be connected to the vertical gate 583, may be formed. The contact plug 581 may be extended to an internal side of the vertical gate 583. An insulating layer 561 and the fifth interlayer insulating layer 563 may be interposed between the fourth channel layer 573 and the vertical gate 583.

Next, a seventh interlayer insulating layer 567, first and second connection patterns P1 and P2, an eighth interlayer insulating layer 569, a drain contact plug DCT, and a bit line BL may be formed in a manner substantially similar to the fourth exemplary implementation of the present invention.

Although it is not illustrated, at least one of the first and second connection elements of the fifth exemplary implementation may be substituted with a pipe transistor having a transistor structure.

Figure 10:
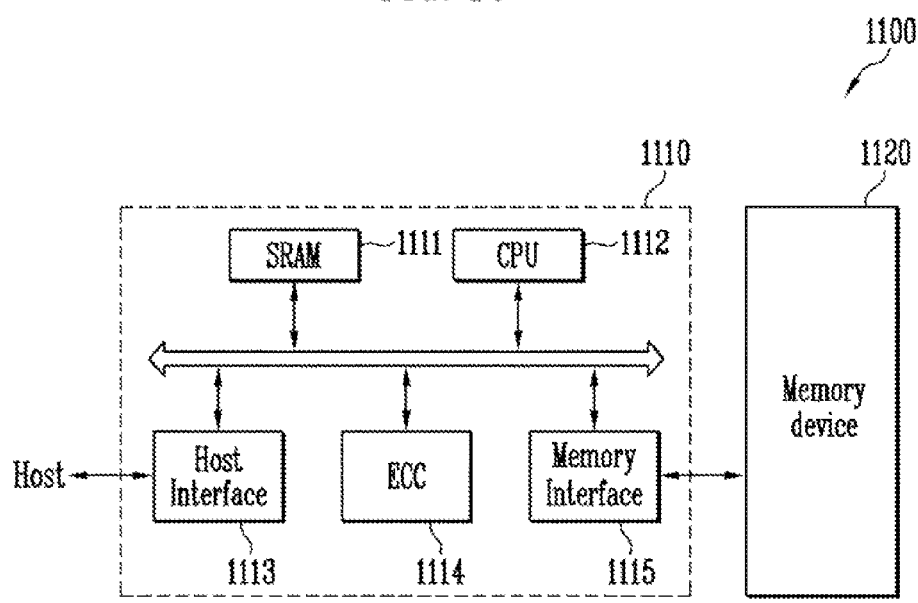
FIG. 10 is a configuration diagram illustrating a memory system according to an exemplary implementation of the present invention.

FIG. 10 is a configuration diagram illustrating a memory system according to an exemplary implementation of the present invention.

Referring to FIG. 10, a memory system 1100 according to the exemplary implementation of the present invention may include a memory device 1120 and a memory controller 1110.

The memory device 1120 may include the semiconductor memory device according to the exemplary implementations described with reference to FIGS. 1 to 9. Further, the memory device 1120 may be a multi-chip package formed of a plurality of flash memory chips.

The memory controller 1110 may be configured to control the memory device 1120, and may include an SRAM 1111, a CPU 1112, a host interface 1113, an ECC 1114, or a memory interface 1115. The SRAM 1111 may be used as an operational memory of the CPU 1112, the CPU 1112 may perform a general control operation for a data exchange of the memory controller 1110, and the host interface 1113 may include a data exchange protocol of a host connected with the memory system 1100. Further, the ECC 1114 may detect and correct an error included in data read from the memory device 1120, and the memory interface 1115 may perform interfacing with the memory device 1120. In addition, the memory controller 1110 may further include an ROM for storing code data for the interfacing with the host.

As described above, the memory system 1100, including the aforementioned structure, may be a memory card or a Solid State Disk (SSD) in which the memory device 1120 is combined with the memory controller 1110. For example, if the memory system 1100 is a SSD, then the memory controller 1110 may communicate with an external device (for example, a host) through one of various interface protocols, such as USB, MMC, PCI-E, SATA, PATA, SCSI, ESDI, or IDE.

Figure 11:
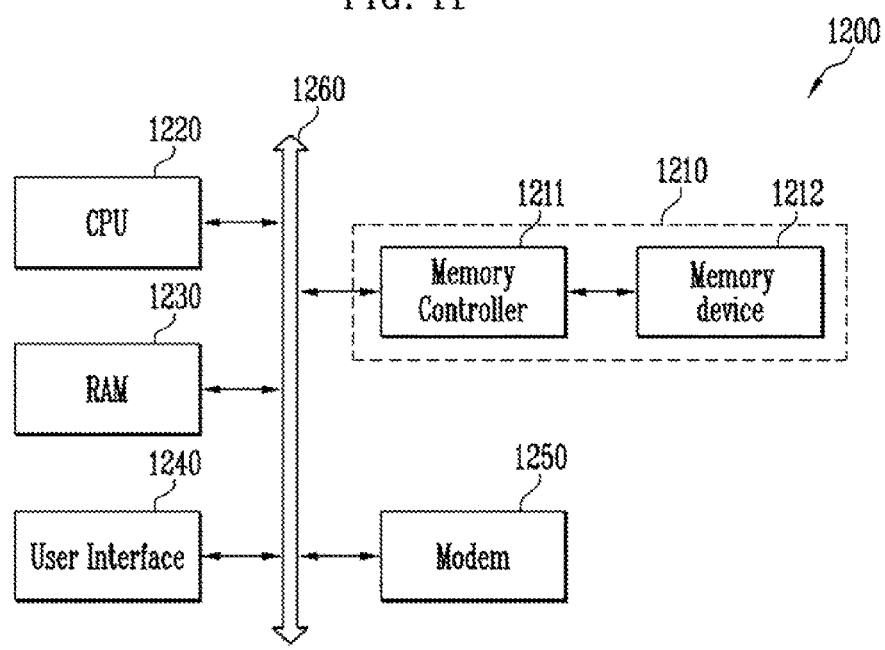
FIG. 11 is a configuration diagram illustrating a computing system according to an exemplary implementation of the present invention.

FIG. 11 is a diagram illustrating a computing system according to the exemplary implementation of the present invention.

Referring to FIG. 11, a computing system 1200 according to the exemplary implementation of the present invention may include a CPU 1220, a RAM 1230, a user interface 1240, a modem 1250, or a memory system 1210, which are electrically connected to a system bus 1260. Further, if the computing system 1200 is a mobile device, then the computing system 1200 may further include a battery for supplying an operational voltage to the computing system 1200, and may further include an application chip-set, a CMOS image sensor CIS, a mobile DRAM, or the like.

The memory system 1210 may be formed of a memory device 1212 and a memory controller 1211 as previously described with reference to FIG. 10.

As described above, the exemplary implementation has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor memory device, comprising:
   a first connection element;
   a first channel layer protruding from the first connection element in a first direction;
   first memory cells surrounding the first channel layer, the first memory cells being stacked along the first channel layer;
   at least one drain select transistor stacked on the first memory cells and surrounding the first channel layer;
   a second channel layer protruding from the first connection element in the first direction;
   second memory cells surrounding the second channel layer, the second memory cells being stacked along the second channel layer;
   a second connection element connected to the second channel layer;
   a third channel layer protruding from the second connection element in a second direction that is substantially opposite to the first direction;
   third memory cells surrounding the third channel layer, the third memory cells being stacked along the third channel layer; and
   at least one source select transistor surrounding the third channel layer, the at least one source select transistor being stacked at lower portions of the third memory cells.

2. The semiconductor memory device of claim 1, wherein the first connection element or the second connection element includes a transistor or a conductive pattern.

3. The semiconductor memory device of claim 1, wherein the at least one drain select transistor and the first memory cells are stacked on the first connection element, the second memory cells are stacked between the first connection element and the second connection element, and the at least one source select transistor and the third memory cells are stacked on a lower portion of the second connection element.

4. The semiconductor memory device of claim 1, further comprising:
a common source line connected to a lower portion of the at least one source select transistor; and
a bit line connected to an upper portion of the at least one drain select transistor.

5. The semiconductor memory device of claim 4,
wherein the common source line is formed on a same level as is the first connection element.

6. The semiconductor memory device of claim 4,
wherein a plurality of strings are symmetrically connected to the common source line.

7. The semiconductor memory device of claim 4, further comprising:
a transistor connected to a lower portion of the common source line to perform a discharge operation of the common source line.

8. The semiconductor memory device of claim 7, wherein the transistor may include:
a gate insulating layer formed on a substrate at a lower portion of the common source line; and a gate formed on the gate insulating layer.

9. The semiconductor memory device of claim 4, further comprising:
a plurality of transistors stacked on the common source line and connected to the common source line to perform a discharge operation of the common source line.

10. The semiconductor memory device of claim 9, wherein the plurality of transistors may include:
gate patterns stacked on the common source line;
a channel layer passing through the gate patterns, the channel layer being connected to the common source line and to a ground terminal; and
a gate insulating layer formed between the gate patterns and the channel layer and surrounding the channel layer.

11. The semiconductor memory device of claim 10, further comprising:
a contact plug passing through the gate patterns, the contact plug being commonly connected to the gate patterns and having one end connected to a gate voltage supply terminal.

12. The semiconductor memory device of claim 9,
wherein a plurality of strings are symmetrically connected to the common source line with the plurality of transistors interposed therebetween.

13. The semiconductor memory device of claim 4, further comprising:
a transistor disposed on the common source line, the transistor being connected to the common source line to perform a discharge operation of the common source line.

14. The semiconductor memory device of claim 13, wherein the transistor may include:
a vertical gate, formed on the common source line, spaced apart from the common source line;
a channel layer disposed in parallel to the vertical gate, with an insulating layer interposed therebetween;
a drain layer connected between the channel layer and the common source line; and
a source layer formed on the channel layer, the source layer being connected to a ground terminal.

15. The semiconductor memory device of claim 14, further comprising:
a contact plug passing through and connected to the vertical gate, the contact plug being connected to a gate voltage supply terminal.

16. The semiconductor memory device of claim 14,
wherein a plurality of strings are symmetrically connected to the common source line, with the vertical gate and the channel layer interposed therebetween.

17. The semiconductor memory device of claim 14,
wherein the source layer or the drain layer include a doped polysilicon layer.

18. A semiconductor memory device, comprising:
a first pipe gate;
a common source line formed on the same level as the first pipe gate;
a second pipe gate formed over the first pipe gate and the common source line;
a bit line formed over the second pipe gate;
first memory cells serially connected between the bit line and the first pipe gate;
second memory cells serially connected between the first pipe gate and the second pipe gate; and
third memory cells serially connected between the second pipe gate and the common source line.

* * * * *